United States Patent [19]

Porta et al.

[11] Patent Number: 5,221,362
[45] Date of Patent: Jun. 22, 1993

[54] NON-HALOGENATED AQUEOUS CLEANING SYSTEMS

[75] Inventors: Earnest W. Porta, Landenberg, Pa.; James M. Ridgway, Jr., Pennsgrove, N.J.; Rudolf E. Svadlenak, Sunriver, Oreg.

[73] Assignee: E. I. Du Pont de Nemours and Company, Wilmington, Del.

[21] Appl. No.: 749,163

[22] Filed: Aug. 23, 1991

[51] Int. Cl.$^5$ ............................................. C23G 5/032
[52] U.S. Cl. ..................... 134/40; 252/143; 252/170
[58] Field of Search .................. 252/143, 170; 134/40

[56] References Cited

U.S. PATENT DOCUMENTS

| | | | |
|---|---|---|---|
| 2,581,820 | 1/1952 | Stright | 252/143 X |
| 2,644,766 | 7/1953 | Levine | 252/170 X |
| 4,024,085 | 5/1977 | Kobayashi et al. | 252/170 X |
| 4,087,370 | 5/1978 | Singalewitch et al. | 252/170 X |
| 4,181,622 | 1/1980 | Gavin | 252/170 X |
| 4,239,552 | 12/1980 | Perner et al. | 252/170 X |
| 4,690,887 | 9/1987 | Furuda et al. | 252/170 X |
| 4,797,220 | 1/1989 | Miller | 252/143 X |

FOREIGN PATENT DOCUMENTS

| | | | |
|---|---|---|---|
| 58-032669 | 2/1983 | Japan | 252/143 |
| 30-86798 | 4/1991 | Japan | 252/170 |

*Primary Examiner*—Patrick P. Garvin
*Attorney, Agent, or Firm*—Don O. Winslow

[57] ABSTRACT

Non-halogenated aqueous degreasing compositions-useful for removing inks and cleaning printed circuit boards comprising a three-component mixture of (1) an organic acid consisting essentially of an alkanoic acid, preferably a hydroxy-substituted alkanoic acid, (2) a straight chain alkanol having at least four carbon atoms or an alkyl ester derived from an unsubstituted or substituted alkanoic acid and a straight chain alkanol having at least four carbon atoms and (3) water.

15 Claims, No Drawings

NON-HALOGENATED AQUEOUS CLEANING SYSTEMS

BACKGROUND OF THE INVENTION

This invention relates to environmentally safe, biodegradable compositions free of halogenated hydrocarbons for use in degreasing and cleaning during the fabrication of printed circuit and printed wiring boards, as well as for cleaning metals, particularly stainless steel, and plastic and earthware items. More particularly, the invention provides cleaning methods and non-halogenated compositions for the removal of inks, wax, grease and soil from a wide variety of substrates.

The gradual phase out of halogenated hydrocarbon solvents such as 1,1,1-trichloroethane or "Freon 113" from the market place has created an immediate and pressing need for environmentally compatible cleaning, desoiling and/or degreasing systems. Such phase out has had and will continue to have a particularly significant impact on the electronic circuit board cleaning and metal degreasing business. Other areas of commercial activity besides electronics affected by this phasing out of chlorinated and brominated hydrocarbons include the cleaning of machine tools, pumps and seals, automotive parts, precision instruments and the like.

SUMMARY OF THE INVENTION

It is an object of the present invention to provide a composition and method for safe and effective removal of grease, fluxes, adhesive tape residues, printing inks and the like from such substrates as wiring boards without otherwise adversely affecting the substrate.

The compositions intended to be included within the invention are stable, fast acting, biodegradable, non-flammable, non-corrosive, ecologically harmless, and environmentally compatible.

The present invention provides a cleaning system comprising at least three distinct components —an organic acid selected from the group consisting of alkanoic acids, preferably hydroxy substituted alkanoic acids; an alcohol of at least four carbons or an alkyl ester derived from any such alcohol and an alkanoic acid; and water. The preferred alkanoic acids including the hydroxy substituted alkanoic acid useful in applicants' invention are acetic acid, hydroxyacetic acid, lactic acid, citric acid, malic acid, and tartaric acid. Of these, lactic acid and hydroxyacetic acid (glycolic acid) are most preferred. The preferred ester is butyl lactate and the preferred alcohol is 1-butanol.

DETAILED DESCRIPTION OF THE INVENTION

The cleaning composition of the present invention can be employed upon any substrate surface, particularly one to which residual excess flux is present such as after a solder operation. A preferred substrate surface is a printed circuit board surface which may or may not be protected by a solder mask permanent coating in areas where solder is not to adhere.

In the present invention a combination of an organic acid is employed with an ester or alcohol and water. The exact type of organic acid useful in the invention is not critical for cleaning effectiveness and can be selected from the broad class described above provided that it is not classified as a flammable liquid (i.e., Flash Point at or above 100° F. by Tag Closed Cup Method).

In the composition of the present invention, it has been found that water in the composition serves to increase cleaning effectiveness, i.e., measured by a reduction of ionic contamination. The concentration of water is not critical, but generally it will be in an amount not greater than about 65% by total weight of the composition. The weight percent of water generally varies from about 7 to 20.

The ratio of organic acid to ester (alcohol) is likewise not critical. The percentage of these two components can vary within wide ranges such as 10 to 70% acid and conventionally from 10% to 75% ester on the basis of the weight percent of the total composition. Additionally, if a combination of esters and/or alcohols is employed, the respective amounts are not considered critical and commercially available mixtures may be directly utilized.

In the use of the cleaning system of the invention the method of contact of the organic acid/ester (alcohol)/water combination with the substrate is not critical. A preferred method of application of the cleaning composition is by spraying, but other conventional contact operations can be employed including a dipping or surface coating process. Elevating the temperature of the cleaning composition up to 90° C. is feasible, but room temperature material may be directly applied. For cleaning printed circuit boards, elevated temperatures in the range of 40° to 60° C. are preferred.

It should be noted that in contrast to most degreasing agents which reside on the high pH side, the present system is on the acid side with the advantage of causing a much lower order of corrosion compared to those of a caustic nature.

To illustrate the various ramifications of the present invention the following examples are provided.

To determine the desoiling/degreasing efficiency of the cleaning systems being claimed a soiled panel was immersed in 200 mL of solvent contained in a 250 mL beaker held at a predetermined temperature (usually 50° C.) in an aqueous environment, i.e., water bath. It is understood that the aqueous environment is the external heat source and not part of the non-halogenated cleaning system being claimed. In some cases a fixed ultrasonic frequency was transmitted to the beaker during the test. The soil weight loss at a given time (usually 2.5 minutes) for several solvents was used to estimate the desoiling efficacy of one solvent versus another. Preferably, however, weight loss as a function of time was used to estimate the efficacy of one solvent versus another. The soiled panel was prepared by applying 0.25g of grease to a stainless steel panel. Unless otherwise noted, the soil/grease agent employed was Shell Alvania grease #2.

It has been found that degreasing capability was a function of alcohol type, e.g., the longer the pendant chain of the alcohol, the better the desoiling/degreasing capability of the mixed solvent, under the experimental conditions noted. Among the acids studied, degreasing efficiency seems to be independent of the organic acid type except in the case of citric acid. With citric acid, the grease seems to coagulate at the surface with greater ease than with the other acids studied.

The data given in the examples include the weight percent of each component of the compositions based on the normal commercial concentration of the acid as well as based on 100% concentration of the acid component. The normal commercial concentration of hydroxyacetic acid is about 70% while that for lactic acid is 88%. It is to be understood that the acids can be added to applicants' compositions as the 100% acids or as the usually available commercial forms.

EXAMPLE 1

Degreasing Capability versus Prior Art

Cleaning compositions including "Freon" 113, 1,1,1,1-tetrachloroethane and a representative composition of the invention were tested for degreasing capability. The number of grams of grease removed from a constant area in 2.5 minutes was determined using each of the three mentioned solvent cleaning systems. The following table summarizes the results of the tests.

| Solvent System | Grease Removed in 2.5 min @ 50° C. | |
|---|---|---|
| | g | % |
| 30% HAA(70%)/70% BuLac | .14 | 58 |
| 1,1,1,1-tetrachloroethane | .04 | 16 |
| "Freon" 113 | 0.1 | 4 |

EXAMPLE 2

It has been determined that when a system removes greater than 50% of grease, it can be considered satisfactory. On this basis, satisfactory compositions are found to fall between about 0.3 to 0.9 for the mathematical expression $$\frac{\text{wt \% BuLac}}{\text{wt \% BuLac} + \text{wt \% HAA}}$$

wherein BuLac refers to butyl lactate and HAA refers to hydroxyacetic acid. On a more generalized basis, the above expression can be written as follows:

$$\frac{\text{weight \% ester}}{\text{weight \% ester} + \text{weight \% organic acid}} = 0.3 - 0.9$$

and the weight percent of water varies from about 7 to 20.

EXAMPLE 3

Systems containing organic acid/alcohol/water were tested for a series of organic acids and alcohols. The number of grams of grease removed from a constant area in 2.5 minutes were measured. During the tests an ultrasonic frequency was transmitted to the beaker.

| Acid | | Alcohol | Acid/Alcohol/Water | Unit | Loss (g) | Loss (%) |
|---|---|---|---|---|---|---|
| Lactic | (88%) | 1-Pentanol | 26/50/24 | wt. % | 0.25 | 100 |
| | (100%) | | 23/50/27 | wt. % | | |
| Lactic | (88%) | 1-Butanol | 26/15/59 | wt. % | 0.20 | 80 |
| | (100%) | | 23/15/62 | wt. % | | |
| Lactic | (88%) | t-Butanol | 26/15/59 | wt. % | 0.042 | 17 |
| | (100%) | | 23/15/62 | wt. % | | |
| Lactic | (88%) | Ethanol | 28/10/62 | wt. % | 0.018 | 7.2 |
| | (100%) | | 25/10/65 | wt. % | | |
| Lactic | (88%) | 2-Propanol | 27/12/61 | wt. % | .0048 | 1.9 |
| | (100%) | | 24/12/64 | wt. % | | |
| HAA | (70%) | 1-Butanol | 23/15/62 | wt. % | .25 | 100 |
| | (100%) | | 16/15/69 | wt. % | | |
| HAA | (70%) | t-Butanol | 23/15/62 | wt. % | 0.036 | 14 |
| | (100%) | | 16/15/69 | wt. % | | |
| HAA | (70%) | Ethanol | 25/10/62 | wt. % | 0.011 | 4.4 |
| | (100%) | | 18/10/70 | wt. % | | |

-continued

| Acid | | Alcohol | Acid/Alcohol/Water | Unit | Loss (g) | Loss (%) |
|---|---|---|---|---|---|---|
| HAA | (70%) | 2-Propanol | 24/13/63 | wt. % | wt. gain | — |
| | (100%) | | 17/13/70 | wt. % | | |
| CA | | 1-Butanol | 47/12/41 | wt. % | 0.24 | 96 |
| | (100%) | | 43/12/45 | wt. % | | |
| CA | | t-Butanol | 47/12/41 | wt. % | 0.014 | 5.6 |
| | (100%) | | 43/12/45 | wt. % | | |
| CA | | Ethanol | 47/12/41 | wt. % | 0.022 | 8.8 |
| | (100%) | | 43/12/45 | wt. % | | |
| CA | | 2-Propanol | 47/10/43 | wt. % | 0.021 | 8.4 |
| | (100%) | | 43/10/45 | wt. % | | |
| CA | | | 100/0/0 | | wt. gain | — |
| | | 1-Butanol | 0/100/0 | | 0.094 | |

Key:
HAA = hydroxyacetic acid
CA = citric acid.1H$_2$O

EXAMPLE 4

Degreasing Capability for Lactic Acid Based Systems

| Acid | | Alcohol | Acid/Alcohol/Water | Unit | Loss (g) | Loss (%) |
|---|---|---|---|---|---|---|
| Lactic | (88%) | 1-Butanol | 30/15/55 | wt. % | 0.25 | 100 |
| | (100%) | | 26/15/59 | wt. % | | |
| Lactic | (88%) | 1-Pentanol | 30/50/20 | wt. % | 0.25 | 100 |
| | (100%) | | 26/50/24 | wt. % | | |
| Lactic | (88%) | 1-Butanol | 30/50/20 | wt. % | 0.20 | 80 |
| | (100%) | | 26/50/24 | wt. % | | |
| Lactic | (88%) | t-Butanol | 30/50/20 | wt. % | 0.041 | 16 |
| | (100%) | | 26/50/24 | wt. % | | |
| Lactic | (88%) | 2-Propanol | 30/50/20 | wt. % | .005 | 2.0 |
| | (100%) | | 26/50/24 | wt. % | | |

EXAMPLE 5

Degreasing Capability for Hydroxyacetic Acid Based Systems

| Acid | | Alcohol | Acid/Alcohol/Water | Unit | Loss (%) |
|---|---|---|---|---|---|
| HAA | (70%) | 1-Butanol | 80/20/0 | wt. % | (84%) |
| | (100%) | | 56/20/24 | wt. % | |
| HAA | (70%) | 1-Butanol | 60/40/0 | wt. % | (76%) |
| | (100%) | | 42/40/18 | wt. % | |
| HAA | (70%) | 1-Butanol | 40/60/0 | wt. % | (60%) |
| | (100%) | | 28/60/12 | wt. % | |
| HAA | (70%) | 1-Butanol | 20/80/0 | wt. % | (92%) |
| | (100%) | | 14/80/6 | wt. % | |
| HAA | (70%) | 1-Butanol | 5/95/0 | wt. % | (40%) |
| | (100%) | | 3.5/95/1.5 | wt. % | |
| HAA | (70%) | 1-Butanol | 95/5/0 | wt. % | (4%) |
| | (100%) | | 66.5/5/28.5 | wt. % | |
| HAA | (70%) | 1-Butanol | 32/68/0 | wt. % | (100%) |
| | (100%) | | 22.4/68/9.6 | wt. % | |
| HAA | (70%) | 1-Butanol | 13/87/0 | wt. % | (100%) |
| | (100%) | | 9.1/87/3.9 | wt. % | |
| HAA | (70%) | 1-Pentanol | 5/95/0 | wt. % | (40%) |
| | (100%) | | 3.5/95/1.5 | wt. % | |
| HAA | (70%) | 1-Pentanol | 20/80/0 | wt. % | (84%) |
| | (100%) | | 14/80/6 | wt. % | |
| HAA | (70%) | 1-Pentanol | 40/60/0 | wt. % | (100%) |
| | (100%) | | 28/60/12 | wt. % | |
| HAA | (70%) | 1-Pentanol | 60/40/0 | wt. % | (100%) |
| | (100%) | | 42/40/18 | wt. % | |
| HAA | (70%) | 1-Pentanol | 80/20/0 | wt. % | (100%) |
| | (100%) | | 56/20/24 | wt. % | |
| HAA | (70%) | 1-Pentanol | 95/5/0 | wt. % | (4%) |
| | (100%) | | 66.5/5/28.5 | wt. % | |

-continued

| Acid | | Alcohol | Acid/ Alcohol/ Water | Unit | Loss (%) |
|---|---|---|---|---|---|
| HAA | (70%) | 1-Pentanol | 90/10/0 | wt. % | (88%) |
|  | (100%) |  | 63/10/27 | wt. % |  |

EXAMPLE 6

Because alcohols have a relatively higher vapor pressure than the corresponding esters, butyl lactate was substituted in this example for the alcohol. It was noted that degreasing characteristics for the compositions of the invention were not dependent on the precise type of organic acid used. Ultrasonic radiation was employed in each of the following tests.

| Acid | | Ester | Acid/Ester/ Water | Unit | Loss (%) |
|---|---|---|---|---|---|
| Lactic | (88%) | BuLac | 15/30/55 | wt. % | (60%) |
|  | (100%) |  | 13/30/57 | wt. % |  |
| Lactic | (88%) | BuLac | 15/85/0 | wt. % | (100%) |
|  | (100%) |  | 13/85/1.8 | wt. % |  |
| HAA | (70%) | BuLac | 30/70/0 | wt. % | (100%) |
|  | (100%) |  | 21/70/9 | wt. % |  |
| HAA | (70%) | BuLac | 70/30/0 | wt. % | (100%) |
|  | (100%) |  | 49/30/21 | wt. % |  |
| CA |  | BuLac | 13/72/15 | wt. % | (100%) |
|  | (100%) |  | 12/72/16 | wt. % |  |
| CA |  | BuLac | 15/70/15 | wt. % | (100%) |
|  | (100%) |  | 14/70/16 | wt. % |  |

EXAMPLE 7

When comparing a HAA composition to one in which HAC (acetic acid) had been substituted for the HAA (on a equal weight basis) it was found that, although the two compositions had the same ultimate desoiling/degreasing capacity, the HAA composition resulted in a greater weight loss during a shorter time period.

| Acid | Ester | Acid/Ester/ Water | Unit | Time (min.) | Loss (g) | Loss (%) |
|---|---|---|---|---|---|---|
| HAA (70%) | BuLac | 30/50/20 | wt % | 0.5 | 0.13 | 52 |
|  |  | 21/50/29 | wt % | 1.0 | 0.25 | 100 |
| Acetic Acid | BuLac | 21/50/29 | wt % | 0.5 | 0.008 | 3 |
|  |  | 0.35/0.34/1.6 | wt % | 1.0 | 0.047 | 19 |
|  |  | 15/15/70 | wt % | 1.5 | 0.25 | 100 |

EXAMPLE 8

Degreasing Capability with Varying HAA/BuLac Ratio

| Acid | | Ester | Acid/Ester/ Water | Unit | Loss (%) |
|---|---|---|---|---|---|
| HAA | (70%) | BuLac | 80/20/0 | wt % |  |
|  | (100%) |  | 56/20/24 | wt % | 9% |
| HAA | (70%) | BuLac | 70/30/0 | wt % |  |
|  | (100%) |  | 49/30/21 | wt % | 56% |
| HAA | (70%) | BuLac | 50/30/20 | wt % |  |
|  | (100%) |  | 35/30/35 | wt % | 88% |
| HAA | (70%) | BuLac | 40/40/20 | wt % |  |
|  | (100%) |  | 28/40/32 | wt % | 88% |
| HAA | (70%) | BuLac | 30/60/10 | wt % |  |
|  | (100%) |  | 21/60/19 | wt % | 100% |

Example 9

Effect of BuLac/HAA ratio Between 0.2 and 2.5 (100% basis) For Systems Containing 21—41% $H_2O$ Desoiling/degreasing capability increases for a BuLac/HAA ratio between 0.2 and 1.0, then is nearly independent for a BuLac/HAA ratio between 1.0 and 2.5.

| System (Stagnant - 2.5 minutes) | Ratio | Loss (g) | Loss (%) |
|---|---|---|---|
| HAA/BuLac/$H_2O$ | 0.20 | 0.002 | 0.8 |
|  | 0.35 | 0.023 | 9.2 |
|  | 0.61 | 0.14 | 56 |
|  | 0.85 | 0.22 | 88 |
|  | 1.4 | 0.22 | 88 |
|  | 2.5 | 0.22 | 88 |

What is claimed:

1. A biodegradable composition suitable for cleaning solid surfaces comprising by weight (a) 10–90% of an hydroxyl-substituted mono- to tri carboxylic alkanoic acid and (b) 90–10% of an organic compound selected from $C^{4+}$alkanol, an ester of an hydroxyl-substituted mono- to tri-carboxylic alkanoic acid and a $C^{4+}$alkanol, an ester of a mono- to tri-carboxylic alkanoic acid and a $C^{4+}$alkanol and mixtures thereof, both (a) and (b) being dissolved in (c) water.

2. A biodegradable composition suitable for cleaning solid surfaces comprising by weight (a) 10–90% of mono- to tri-carboxylic alkanoic acid and (b) 90–10% of an ester of a $C^{4+}$alkanol with either a mono- to tri-carboxylic alkanoic acid or a hydroxyl-substituted mono-to tri-carboxylic alkanoic acid, both (a) and (b) being dissolved in (c) water.

3. The composition of claim 1 or claim 2 which contains 30–90% (a) and 70–10% (b).

4. The composition of claim 1 or claim 2 which contains 7–20% water, basis total composition.

5. The composition of claim 1 in which component (a) is selected from the group consisting of hydroxyacetic acid, lactic acid, malic acid, tartaric acid, and citric acid.

6. The composition of claim 5 in which the component (a) is lactic acid.

7. The composition of claim 5 in which component (b) is butyl lactate.

8. The composition of claim 2 in which component (a) is acetic acid.

9. A method for cleaning contaminant from solid surfaces comprising applying the composition of claim 1 or claim 2 to the surface at a temperature of 25–90C. for a time sufficient to remove the contaminants from the surface into the composition and then removing the contaminant-containing composition from the solid surface.

10. The method of claim 9 in which the composition is applied to the contaminated surface for at least 30 minutes.

11. A biodegradable composition suitable for cleaning solid surfaces comprising lactic acid and butyl lactate dissolved in water.

12. A degreasing/desoiling composition comprising 10–30% by weight of hydroxyacetic acid, 25–75% by weight of butyl lactate and 15–45% by weight of water.

13. A degreasing/desoiling composition comprising 10–30% by weight of lactic acid, 25–75% by weight of butyl lactate and 15–45% by weight water.

14. A degreasing/desoiling composition comprising 10 to 30% by weight of lactic acid, 25–75% by weight of butyl lactate and the remainder to 100% by weight of water, based on the total weight of the composition.

15. An ecologically harmless, non-toxic, biodegradable cleaning composition comprising about 30 parts by weight of commercial grade hydroxy-acetic acid, about 50 parts by weight of butyl lactate and about 20 parts by weight of water.

* * * * *